United States Patent
Cai et al.

(10) Patent No.: US 11,646,240 B2
(45) Date of Patent: May 9, 2023

(54) THROUGH-HOLE MOUNTED SEMICONDUCTOR ASSEMBLIES

(71) Applicant: NVIDIA Corporation, Santa Clara, CA (US)

(72) Inventors: Joey Cai, Shenzhen (CN); Tiger Yan, Shenzhen (CN); Jacky Zhu, Shenzhen (CN); Oliver Yi, Shenzhen (CN)

(73) Assignee: NVIDIA Corporation, Santa Clara, CA (US)

( * ) Notice: Subject to any disclaimer, the term of this patent is extended or adjusted under 35 U.S.C. 154(b) by 170 days.

(21) Appl. No.: 17/166,257

(22) Filed: Feb. 3, 2021

(65) Prior Publication Data
US 2022/0246487 A1    Aug. 4, 2022

(51) Int. Cl.
*H01L 23/13* (2006.01)
*H01L 23/367* (2006.01)
*H01L 23/544* (2006.01)
*H01L 23/00* (2006.01)
*H01L 23/498* (2006.01)
*H05K 1/00* (2006.01)

(52) U.S. Cl.
CPC .......... *H01L 23/13* (2013.01); *H01L 23/3675* (2013.01); *H01L 23/49838* (2013.01); *H01L 23/544* (2013.01); *H01L 23/562* (2013.01); *H05K 1/00* (2013.01); *H01L 2223/54426* (2013.01)

(58) Field of Classification Search
CPC ............... H01L 23/3675; H01L 23/13; H01L 23/49838; H01L 23/544; H01L 23/562; H01L 2223/54426; H05K 1/00
See application file for complete search history.

(56) References Cited

U.S. PATENT DOCUMENTS

| | | | | |
|---|---|---|---|---|
| 5,095,404 A | * | 3/1992 | Chao | H01L 23/4006 361/783 |
| 5,825,625 A | * | 10/1998 | Esterberg | H01L 24/86 361/705 |
| 5,920,117 A | * | 7/1999 | Sono | H01L 23/3128 257/676 |

(Continued)

OTHER PUBLICATIONS

Brian Benchoff, "Oreo Construction: Hiding Your Components Inside the PCB," hackaday.com, as downloaded from https://hackaday.com/2019/01/18/oreo-construction-hiding-your-components-inside-the-pcb/ on Jan. 4, 2021.

*Primary Examiner* — Bilkis Jahan
*Assistant Examiner* — Victor V Barzykin (57) ABSTRACT

Through-hole mounted semiconductor assemblies are described. A printed circuit board ("PCB") has first and second PCB sides and has a through hole therein. The through hole defines a hole area. A semiconductor package may be disposed in the hole area such that the semiconductor package is at least partially exposed on one or more of the first and the second PCB sides. Package contacts on the semiconductor package may be electrically coupled to PCB contacts disposed on one or more of the PCB sides. In some embodiments, one or more support structures may be coupled to the PCB and may touch the semiconductor package. In some embodiments, cooling devices may be placed in thermal communication with the semiconductor package on both sides of the PCB.

22 Claims, 10 Drawing Sheets

(56) References Cited

U.S. PATENT DOCUMENTS

| | | | |
|---|---|---|---|
| 7,652,381 B2* | 1/2010 | Grundy | H01L 23/13 |
| | | | 257/723 |
| 7,706,144 B2* | 4/2010 | Lynch | H01L 23/3677 |
| | | | 174/16.3 |
| 7,782,622 B1* | 8/2010 | Sun | H05K 3/301 |
| | | | 257/718 |
| 2005/0189640 A1* | 9/2005 | Grundy | H05K 1/182 |
| | | | 257/E25.023 |
| 2010/0127402 A1* | 5/2010 | Grundy | H05K 1/182 |
| | | | 257/784 |

* cited by examiner

THROUGH-HOLE MOUNTED SEMICONDUCTOR ASSEMBLIES

BACKGROUND

In many electronic systems, one or more very large-scale integrated circuit ("VLSI") components is coupled to a host system printed circuit board ("PCB"). Such VLSI components may include, for example, central processing unit ("CPU) devices and graphics processing unit ("GPU") devices. Traditionally, a CPU and/or a GPU is coupled to a PCB using either a ball grid array ("BGA"), a pin grid array ("PGA"), or a land grid array ("LGA") technique. All of these techniques involve placing a high number of connection points on the bottom side of the VLSI component package arranged in rows and columns to form a grid like pattern. This grid of connection points is coupled to a corresponding grid of connection points on the PCB, either by soldering them directly to the PCB or by inserting the VLSI package into a socket that has previously been soldered onto the PCB.

A number of problems are associated with these traditional techniques. First, BGA and similar packages—and especially the points at which they are connected to the PCB—are prone to mechanical damage caused by thermal expansion and by flexural stresses that may be applied to the PCB. This mechanical damage can lead to reliability problems in the components and in the connections between the components and the rest of the system. Second, the connection points between the VLSI package and the PCB or between the VLSI package socket and the PCB are all located underneath the package or the socket. This location makes it difficult to inspect the quality of the solder connections under the package or socket after the package or socket has been soldered onto the PCB. Third, when these traditional mounting techniques are in use, options for cooling the VLSI components become limited. For example, in BGA and similar systems, only the top side of the VLSI package is available for coupling to a cooling device such as a fan, heat sink or liquid cooling system.

BRIEF DESCRIPTION OF THE DRAWINGS

Techniques and apparatus for addressing these and other challenges will be described below with reference to the accompanying drawings, in which like reference numbers generally denote like or similar elements.

FIGS. 20-25 are various views illustrating an example class of alignment features in which a raised element on the semiconductor package extends away from the semiconductor package in the direction of the support structure and engages a corresponding element on the support structure in accordance with embodiments.

DETAILED DESCRIPTION

This disclosure describes multiple embodiments by way of example and illustration. It is intended that characteristics and features of all described embodiments may be combined in any manner consistent with the teachings, suggestions and objectives contained herein. Thus, phrases such as "in an embodiment," "in one embodiment," and the like, when used to describe embodiments in a particular context, are not intended to limit the described characteristics or features only to the embodiments appearing in that context.

The phrases "based on" or "based at least in part on" refer to one or more inputs that can be used directly or indirectly in making some determination or in performing some computation. Use of those phrases herein is not intended to foreclose using additional or other inputs in making the described determination or in performing the described computation. Rather, determinations or computations so described may be based either solely on the referenced inputs or on those inputs as well as others. The phrase "configured to" as used herein means that the referenced item, when operated, can perform the described function. In this sense an item can be "configured to" perform a function even when the item is not operating and is therefore not currently performing the function. Use of the phrase "configured to" herein does not necessarily mean that the described item has been modified in some way relative to a previous state. "Coupled" as used herein refers to a connection between items. Such a connection can be direct or can be indirect through connections with other intermediate items. Uses of the term "coupled" and its variants herein may include the coupling of components by electrically conductive connections or paths except where the context clearly indicates otherwise. Terms used herein such as "including," "comprising," and their variants, mean "including but not limited to." Articles of speech such as "a," "an," and "the" as used herein are intended to serve as singular as well as plural references except where the context clearly indicates otherwise.

Numerous example embodiments will be described below in which a semiconductor package is mounted within a through hole of a PCB. Although PCBs having certain types and form factors appear in the drawings and the discussion, it should be noted that the illustrated and described types and form factors are provided by way of example only. Persons having skill in the art and having reference to this disclosure will readily appreciate that the same or similar apparatus and techniques may also be employed with PCBs having other types and form factors. For example, in some embodiments, the PCB to which the semiconductor package is mounted may comprise an add-in card, such as a PCIe card, that is configured to be coupled to a system board or motherboard of a host system. In other embodiments, the PCB to which the semiconductor package is mounted may be the system board or motherboard of the host system itself. Moreover, the system board or the motherboard may be associated with any type of host system. For example, the PCB may comprise the system board in a multi-node rack-mounted server in a data center, or it may comprise the motherboard of a workstation, desktop, laptop, or mobile device. Other embodiments are also possible.

The semiconductor package that is mounted to the PCB may also take a variety of forms. For example, the semiconductor package may comprise any VLSI device, such as a CPU or a GPU, or it may comprise a substrate that houses a multi-chip system. Other embodiments are also possible.

Figure 1:
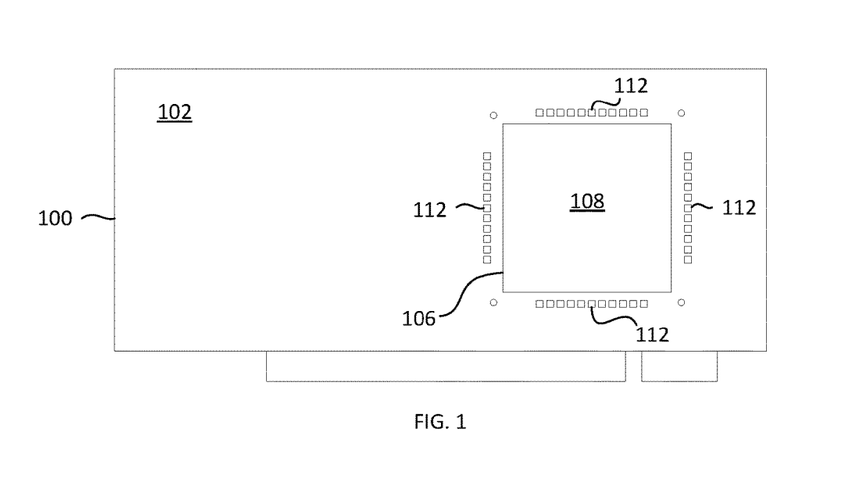
FIGS. 1 and 2 are bottom and top views, respectively, of a PCB having a through hole therein configured to receive a semiconductor package in accordance with embodiments.
Figure 2:
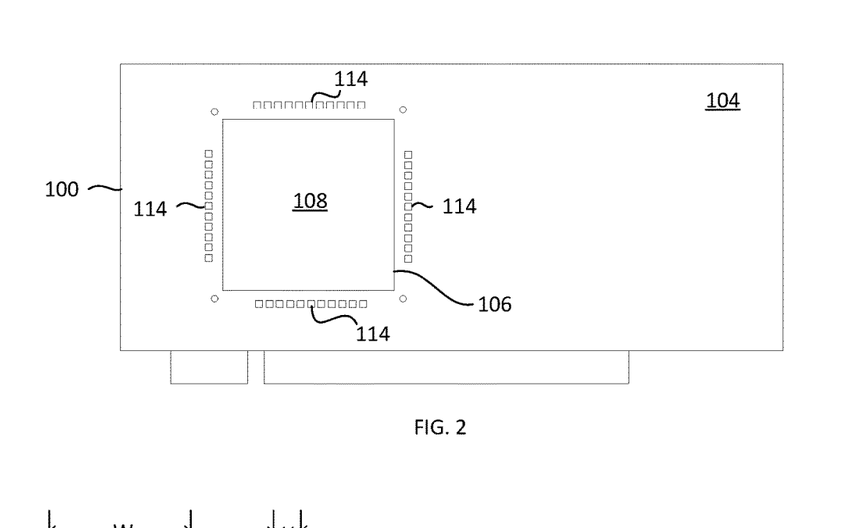

FIGS. 1 and 2 are bottom and top views, respectively, illustrating a PCB 100 according to embodiments. The PCB is generally planar, has a top side 104 and a bottom side 102, and has a through hole 106 therein that extends completely through the material of the PCB in a direction substantially orthogonal to the plane of the PCB. The through hole defines a hole area 108 that is configured to receive a semiconductor package 110 (see FIGS. 3A-3C). The semiconductor package includes a substrate that defines a package plane 112 and has a top package side 118 and a bottom package side 122.

The through hole of the PCB is configured to receive the semiconductor package in an orientation such that the plane of the PCB is substantially parallel with the package plane. Thus, the hole area defined by the through hole of the PCB should be at least as large as the area defined by the semiconductor package substrate (L×W), so that the semiconductor package will fit within the hole area of the PCB when oriented in this manner. The semiconductor package has a thickness, or height, H. The thickness of the semiconductor package may be, but need not be, the same as the thickness as the PCB. In some embodiments, the thickness of the semiconductor package may be larger than that of the PCB such that its height dimension may protrude beyond the plane of the PCB on the top side 104, or on the bottom side 102, or both. In other embodiments, the thickness of the semiconductor package may be smaller than that of the PCB.

Figure 4:
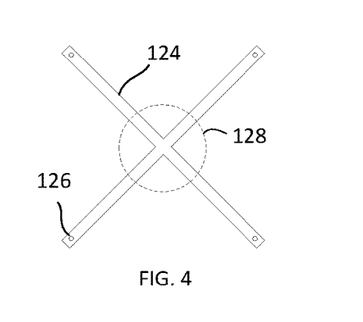
FIG. 4 is an orthogonal view of a support structure having a cruciform shape in accordance with embodiments.

In the illustrated embodiment, a support structure 124 (see FIG. 4) is configured to be coupled to the PCB such that, when so coupled, the structure will extend at least partially over the through hole. The support structure may be substantially rigid so that it is able to support the semiconductor package when the semiconductor package is placed in the through hole. For example, in some embodiments the support structure may be made of metal, such as steel. The support structure may be coupled to the PCB using any suitable technique, such as by using fasteners, or by soldering, or by using adhesives. In the embodiment of FIG. 4, the support structure has a generally cruciform shape and defines four ends. A hole 126 is located at each of the four ends to receive a fastener, such as a bolt, for coupling the support structure to the PCB. The support structure is configured such that, when mounted to the PCB, its center 128 will be disposed over the hole area of the PCB to support the semiconductor package.

Figure 5:
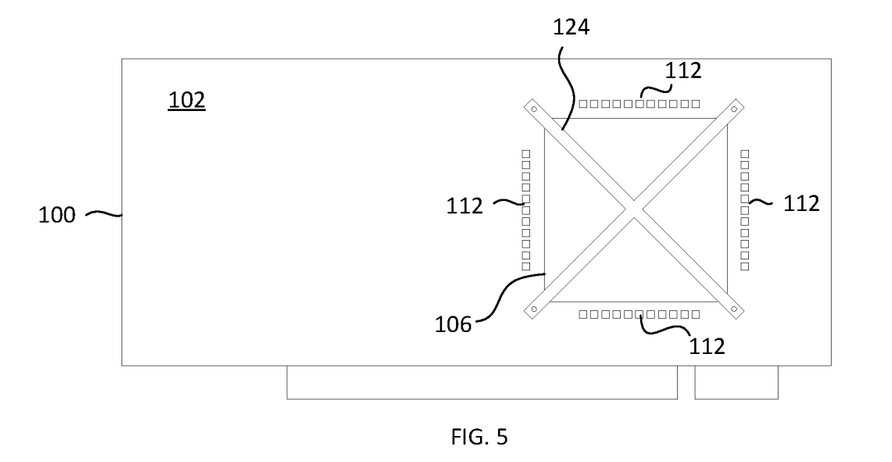
FIG. 5 is a bottom view of the PCB of FIGS. 1 and 2 with the support structure of FIG. 3 coupled to the PCB in accordance with embodiments.

FIG. 5 shows the support structure of FIG. 4 bolted to the bottom side of the PCB of FIGS. 1 and 2. As can be seen in the drawing, the support structure extends at least partially over the through hole. Although FIG. 5 illustrates the support structure coupled to the bottom side of the PCB, in other embodiments, it may be coupled to the top side of the PCB. In still further embodiments to be discussed further below, a support structure may be coupled to the PCB on both the top and the bottom sides of the PCB.

Figure 6:
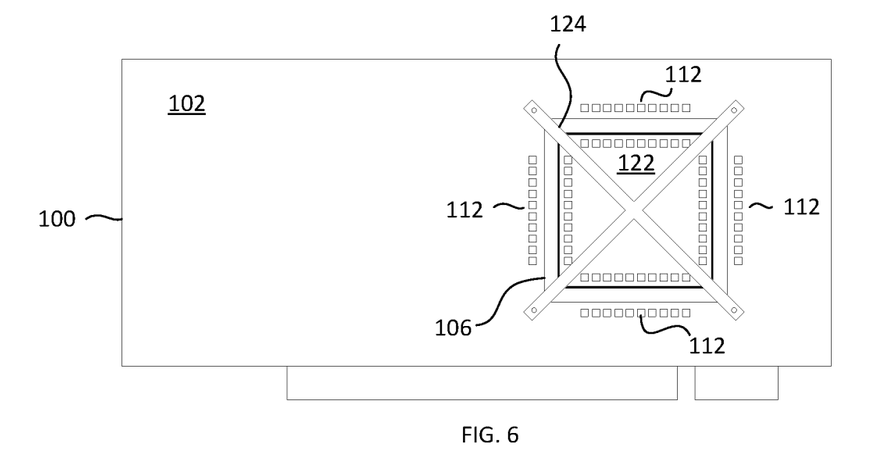
FIG. 6 is a bottom view of the assembly of FIG. 5 with the semiconductor package of FIG. 3 disposed within a hole area defined by the through hole of the PCB in accordance with embodiments.

FIG. 6 illustrates the semiconductor package of FIG. 3 having been placed within the hole area of the through hole of the PCB. The semiconductor package may be oriented so that either its top side or its bottom side faces the support structure. In the embodiment shown, the semiconductor package touches the support structure on its bottom side 122. Even so, the bottom side of the semiconductor package remains at least partially exposed on the bottom side of the PCB as can be seen in the drawing. And, as the view of FIG. 7 illustrates, in this embodiment the top side of the semiconductor package is also at least partially exposed, on the top side of the PCB.

Figure 7:
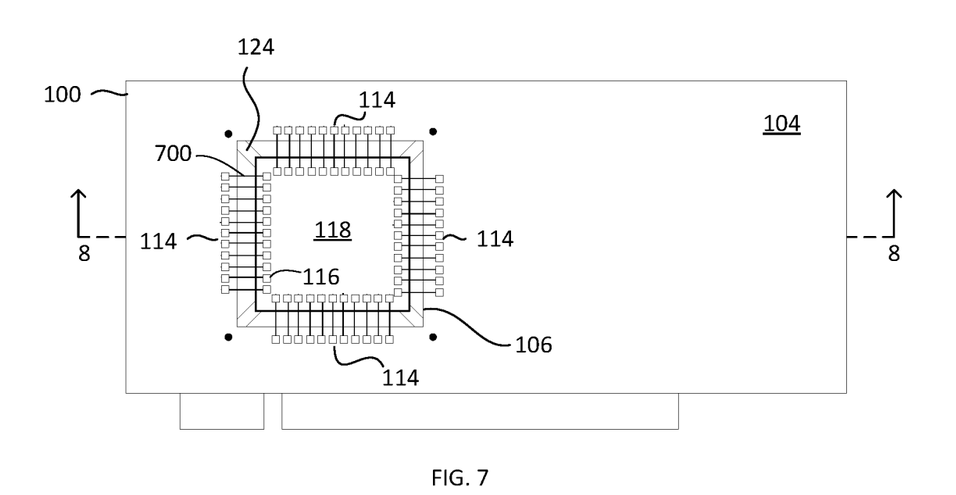
FIG. 7 is a top view of the assembly of FIG. 6 showing package contacts disposed on the top side of the semiconductor package electrically coupled to PCB contacts disposed on the top side of the PCB in accordance with embodiments.
Figures 8, 9:
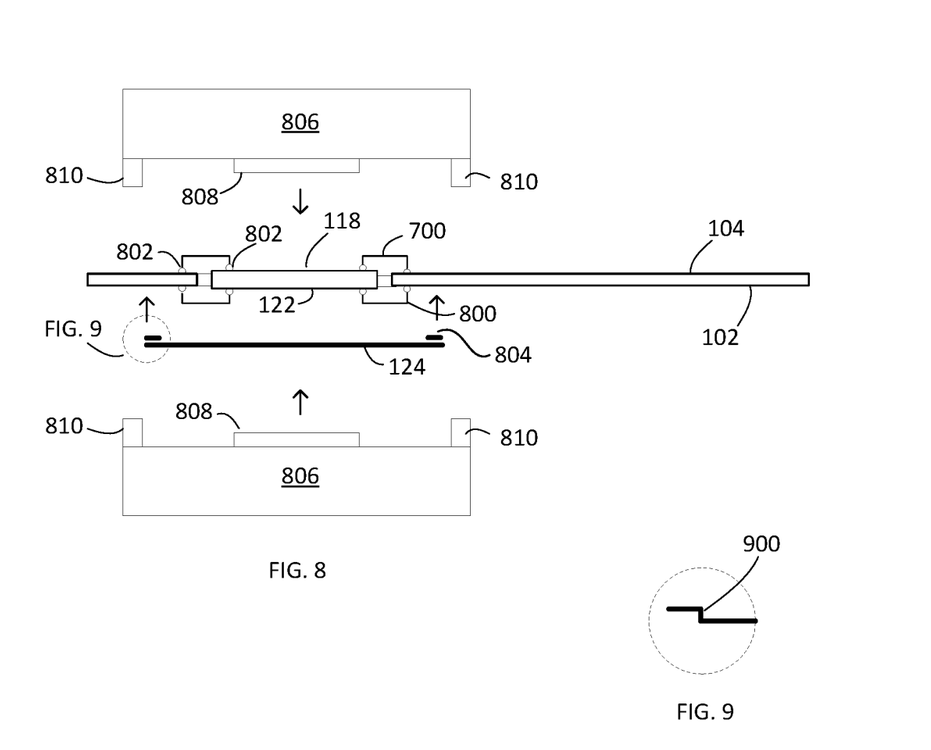
FIG. 8 is a sectional view of the assembly of FIG. 7 showing package contacts disposed on the top and bottom sides of the semiconductor package electrically coupled, respectively, to PCB contacts disposed on the top and bottom sides of the PCB, and additionally showing two cooling devices configured to be coupled to the top and bottom sides of the semiconductor package in accordance with embodiments.
FIG. 9 is a closeup view of the circled area of FIG. 8 illustrating another example technique for coupling a support structure to a PCB in accordance with embodiments.

Example PCB contacts 114 are disposed on the top side of the PCB (see FIGS. 2, 7 and 8). Similarly, example PCB contacts 112 are disposed on the bottom side of the PCB (see FIGS. 1, 5, 6 and 8). In the illustrated embodiment, the through hole of the PCB has a rectangular shape such that it defines four edges, and the PCB contacts are located adjacent to each of the four edges of the through hole. In other embodiments, the PCB contacts need not be located adjacent to the edges of the through hole and need not be located on all four sides of the through hole. The number of PCB contacts shown in the drawing is only for clarity of illustration. In other embodiments, more or fewer PCB contacts may be used. Moreover, the PCB contacts may take any suitable form, such as lands or pads formed on the PCB. In other embodiment they may take the form of pins or sockets configured to be coupled to a corresponding connector. The PCB contacts may be electrically connected to traces formed in or on the PCB to establish connections to other elements of a host computer as appropriate to the application. For example, the traces may be coupled to a PCIe controller, or they may be coupled to a system bus or an input/output bus, which bus may be coupled to a corresponding bus controller that is configured to interface with other components, such as a system memory and/or a CPU on a system board or a motherboard.

Figure 3A:
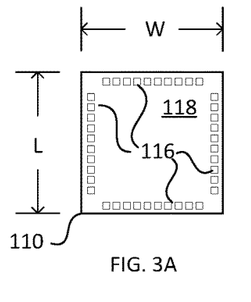
FIGS. 3A-3C are top, side and bottom views, respectively, of a semiconductor package in accordance with embodiments.
Figure 3B:
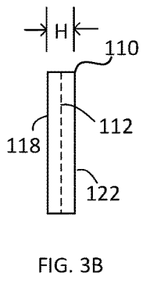
Figure 3C:
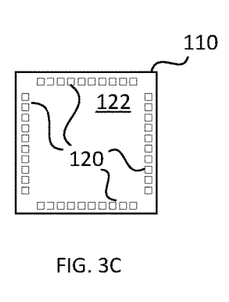

FIG. 3A illustrates example package contacts 116 disposed on the top side of the semiconductor package. In some embodiments, the package contacts are disposed on one side of the semiconductor package only. In the embodiment of FIG. 3, however, the semiconductor package also includes package contacts 120 disposed on the bottom side of the semiconductor package (see FIG. 3C). The package contacts may take any suitable form and may be manufactured using a variety of known techniques. For example, the semiconductor package may include a substrate, on or in which one or more integrated circuit dies is mounted. The package contacts may comprise lands or pads that are exposed on the surface of the substrate. The package contacts may be electrically coupled to circuitry within the integrated circuit die(s) by traces, planes, and/or vias, that are formed on or in the substrate. Other types of package contacts may also be used. For example, the package contacts may take the form of pins or sockets configured to be coupled to a corresponding connector. In embodiments, the number of package contacts present may be more or fewer than the number shown in the illustrations.

The PCB contacts that are disposed on the top side of the PCB may be electrically coupled to the package contacts that are disposed on the top side of the semiconductor package. Similarly, the PCB contacts that are disposed on the bottom side of the PCB may be electrically coupled to the package contacts that are disposed on the bottom side of the semiconductor package (see FIG. 8). In the illustrated embodiment, the electrical coupling between the package contacts and the PCB contacts is accomplished using a plurality of wires 700, 800. As was mentioned above, however, other techniques may be used to accomplish the electrical coupling of the package contacts to the PCB contacts, such as by using connectors and cables. In any embodiments, solder balls 802 may be placed on the lands or pads of either the package contacts or the PCB contacts, or both, and the solder balls may be reflowed or fused once the connecting wires or connectors are in place. In some embodiments, the semiconductor package may be placed on the support frame before the package contacts are electrically coupled to the PCB contacts for added mechanical stability during the connection process.

In the illustrated embodiments, the semiconductor package has a rectangular shape defining four edges, and the package contacts are disposed adjacent each of the four edges of the package. In other embodiments, the package contacts need not be located adjacent the edges of the package and need not be disposed along each of the four edges. Moreover, in the illustrated embodiments, only a single row of contacts is disposed along the edges of the semiconductor package or the through hole of the PCB. In other embodiments, multiple rows of contacts, or one or more clusters or grids of contacts, may be placed on the semiconductor package, or on the PCB, or both. The arrangements of the package contacts on the semiconductor package, and of the PCB contacts on the PCB, may be chosen so that the contacts will be clear of the areas where the support frame couples to the PCB, and the areas where the support frame touches the semiconductor package.

For embodiments in which the height or thickness of the semiconductor package is greater than the thickness of the PCB or otherwise protrudes beyond the plane of the PCB, the support frame may be configured in a variety of ways to accommodate the difference in thickness. For example, as illustrated in FIG. 8, the support frame may be coupled to the PCB using one or more spacers or standoffs 804. Or, as illustrated in FIG. 9, the support structure may include one or more bends 900 at each of its ends, or elsewhere along the structure, as appropriate for the application.

Figure 10:
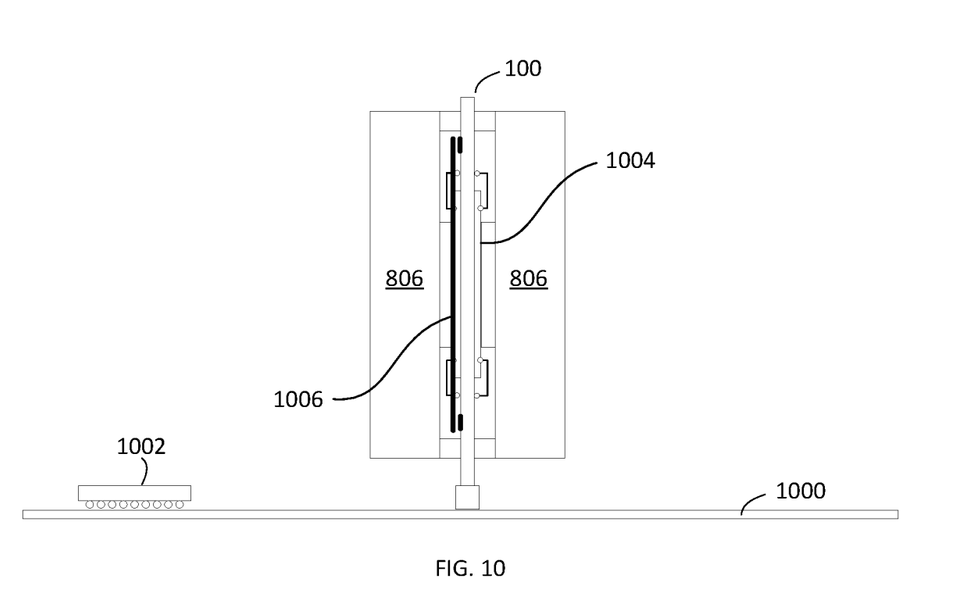
FIG. 10 is an assembled side view of the components shown in FIG. 8, wherein the PCB to which the semiconductor package is coupled is a peripheral component interconnect express ("PCIe") card, which is itself coupled to a PCB of a host system in accordance with embodiments.

A cooling device 806 may be placed in thermal communication with either or both sides of the semiconductor package, as indicated in exploded view in FIG. 8. The cooling device may comprise a passive device such as a heat sink or may comprise an active device such as a fan-driven cooler or a liquid cooling system or heat pipe. In some embodiments, an interface member 808 may be provided to accommodate differences in height between the cooling device and the semiconductor package, or to accommodate the contours of components or differences in component shapes, in order to facilitate good thermal communication between the semiconductor package and the cooling device. (An example embodiment that uses an interface member to accommodate component contours will be further described below in relation to FIGS. 20 and 21.) Moreover, in embodiments in which the support structure is made using a thermally conductive material, such as metal, the thermal communication between the semiconductor package and the cooling device may include a layer comprising a portion of the support structure itself, such that the thermal communication is achieved indirectly through the support structure. The cooling devices may be mounted to the assembly using any suitable technique, such as by bolts or other fasteners 810 coupled to the PCB. In other embodiments, other techniques may be used FIG. 10 is an assembled view of the components of FIGS. 1-8, wherein the PCB 100 to which the semiconductor package is mounted comprises a PCIe card. In the illustrated embodiment, the PCIe card is itself coupled to a system board or motherboard 1000, on which another component such as a CPU 1002 is mounted. As was described above, traces in the system board or mother board 1000, and in the PCIe card, may couple motherboard or system board components such the CPU to circuitry in an integrated circuit die of the semiconductor package. As can be seen in the side view provided by FIG. 10, one of the cooling devices is in thermal communication with the top side of the semiconductor package directly, as indicated at 1004, and one of the cooling devices is in thermal communication with the bottom side of the semiconductor package indirectly, as indicated at 1006.

Figure 11:
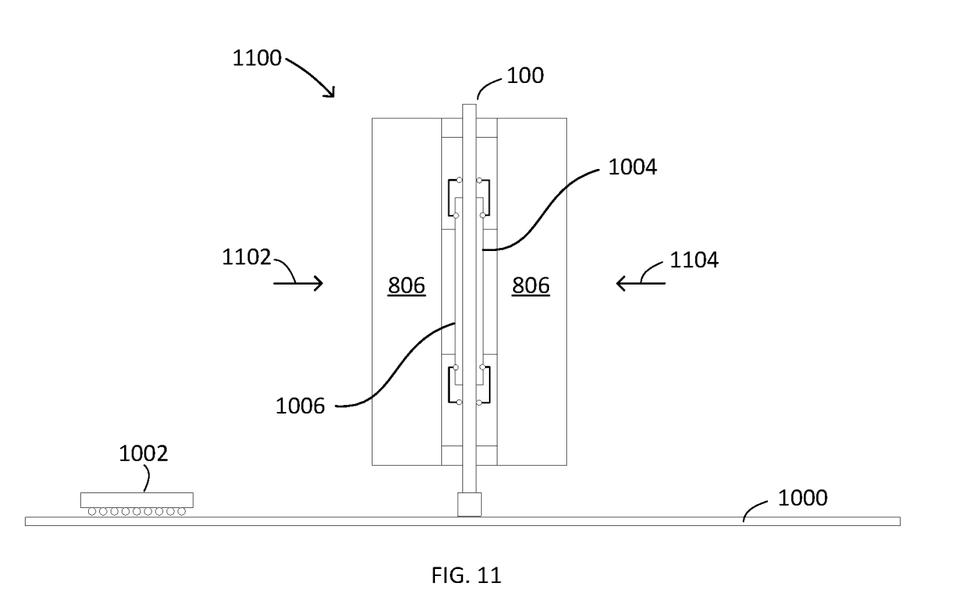
FIG. 11 is an assembled side view illustrating a class of embodiments in which no support structure is present, and in which opposing cooling devices are coupled to both sides of the semiconductor package and to both sides of the PCB.

In embodiments that include a support structure, as do the embodiments of FIGS. 1-10, the support structure may be used to stabilize the semiconductor package in a direction orthogonal to the plane of the PCB (the height or thickness dimension), so that any mechanical forces applied to the semiconductor package by the cooling devices are less likely to compromise the integrity of the electrical connections between the package contacts and the PCB contacts. In other embodiments, such as embodiment 1100 shown in FIG. 11, a support structure may not be included at all. In these embodiments, two opposing cooling devices may be employed as shown such that any mechanical forces applied to the semiconductor package by the cooling devices are applied equal magnitude and in opposite directions 1102, 1104 so that the forces cancel one other. In these embodiments, the integrity of the electrical connections between the semiconductor package and the PCB may be preserved without the need for a separate support structure.

Figure 12:
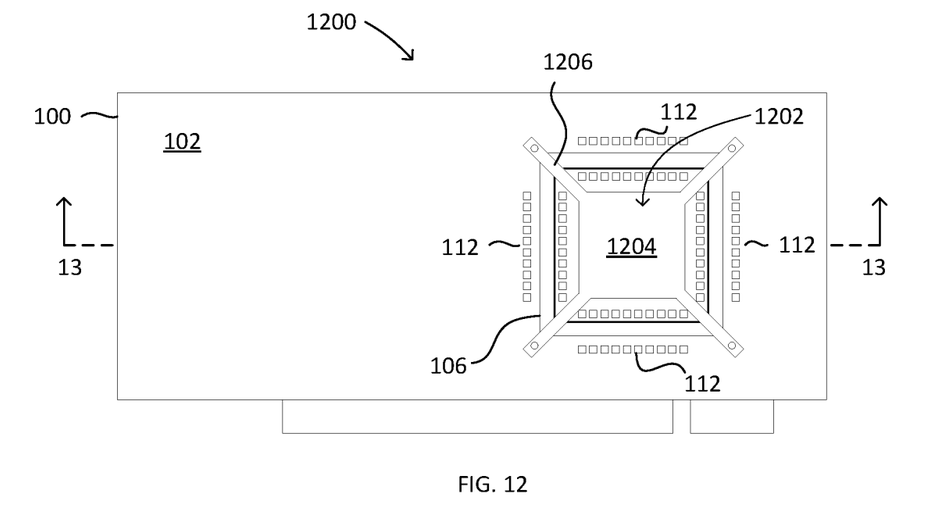
FIG. 12 is a bottom view of a PCB, a semiconductor package, and a support structure, illustrating a class of embodiments in which the support structure includes an element having the form of a plate.
Figure 13:
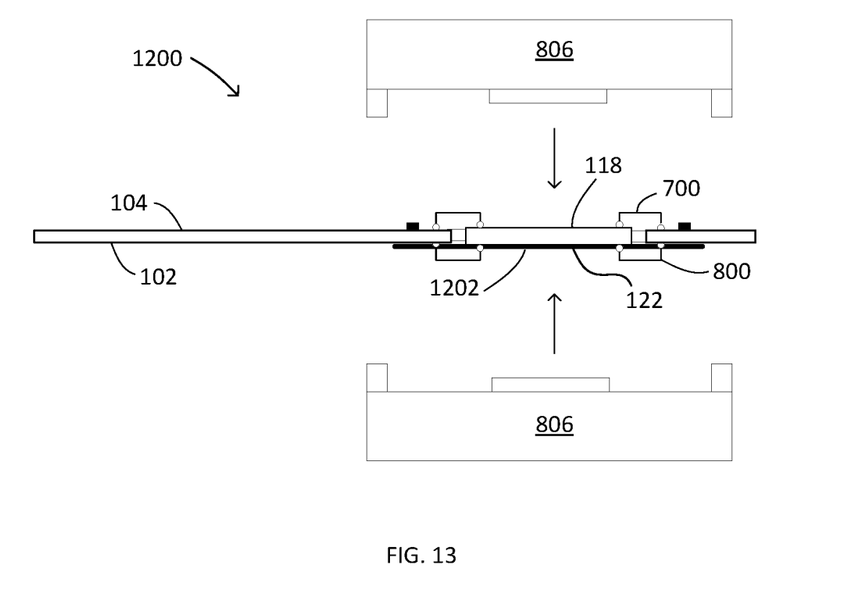
FIG. 13 is a sectional view of the assembly of FIG. 12 showing package contacts disposed on the top and bottom sides of the semiconductor package electrically coupled, respectively, to PCB contacts disposed on the top and bottom sides of the PCB, and additionally showing two cooling devices configured to be coupled to the top and bottom sides of the semiconductor package in accordance with embodiments.

In the embodiments of FIGS. 1-10, the support structure used has a cruciform shape that defines a center and four ends. The support structure in those embodiments is configured such that, when fastened to the PCB at each of its four ends, the center of the support structure is disposed over the hole area of the PCB. In other embodiments, other support structures may be used. For example, in embodiment 1200 shown in FIGS. 12 and 13, an example support structure 1202 includes a plate 1204 with at least two tabs 1206 extending outward from the plate, as shown. In this class of embodiments, the support structure may be fastened to the PCB at each of the tabs such that the plate is disposed over the hole area of the PCB. As in the embodiments of FIGS. 1-10, the semiconductor package is at least partially exposed on the top and the bottom sides of the PCB. Package contacts on the top side of the semiconductor package are electrically coupled to PCB contacts on the top side of the PCB, as shown at 700 in FIG. 13. Package contacts on the bottom side of the semiconductor package are electrically coupled to PCB contacts on the bottom side of the PCB, as shown at 800 in FIG. 13. One cooling device may be placed in thermal communication with the top side of the semiconductor package, and another cooling device may be placed in thermal communication with the bottom side of the semiconductor package, as shown in exploded view in FIG. 13. In this class of embodiments, the support structure may be fabricated using a thermally conductive material, such as metal (e.g., steel), so that thermal communication between the bottom side of the semiconductor package and the adjacent cooling device may be established through the plate portion of the support structure.

Figure 14:
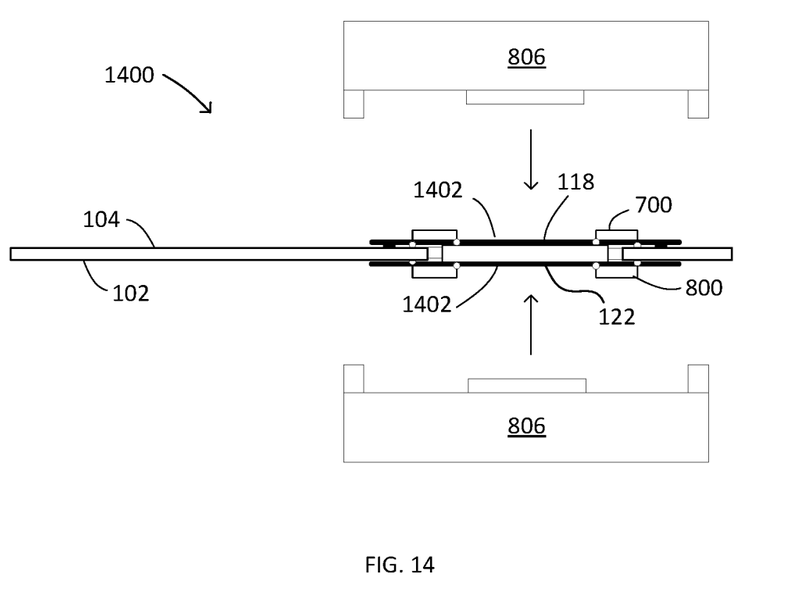
FIG. 14 is a partially exploded sectional view illustrating a class of embodiments in which support structures coupled to the PCB are disposed on both the top and the bottom sides of the semiconductor package and the PCB.

FIG. 14 illustrates another class of embodiments 1400, in which two support structures 1402 may be employed—one on the top side of the semiconductor package, and one on the bottom side of the semiconductor package. The support structures used in these embodiments may take the form of any of the support structures described above, and the two support structures need not be identical. Because the semiconductor package in this class of embodiments is at least partially exposed on the top and the bottom sides of the PCB, as can be seen in FIG. 14, electrical connections may be established between the package contacts on the top side of the semiconductor package and the PCB contacts on the top side of the PCB, as shown at 700, and between the package contacts on the bottom side of the semiconductor package and the PCB contacts on the bottom side of the PCB, as shown at 800. Cooling devices may be placed in thermal communication with both the top and the bottom sides of the semiconductor package, as shown in the exploded view.

Figure 15:
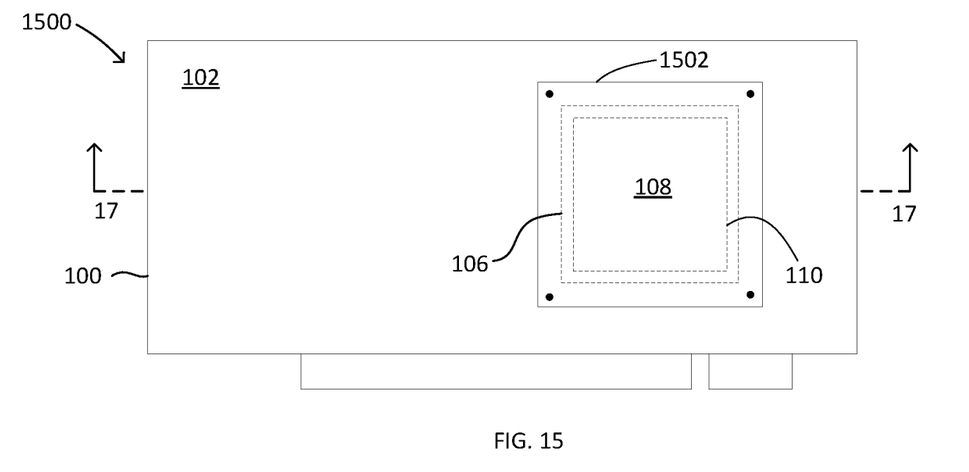
FIGS. 15, 16 and 17 are bottom, top and sectional views, respectively, illustrating a class of embodiments in which a support structure covers the entire hole area defined by the through hole of the PCB.
Figure 16:
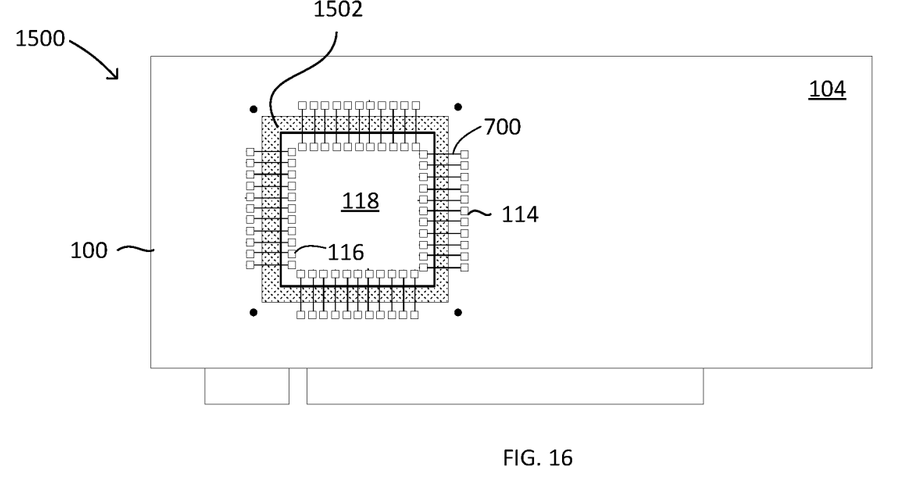
Figure 17:
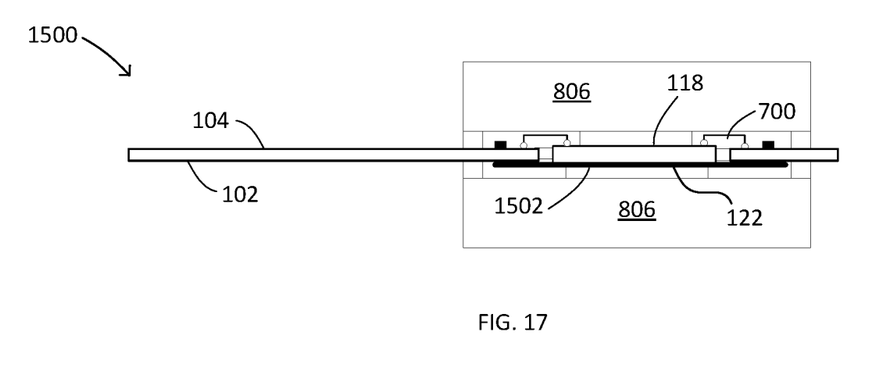

FIGS. 15-17 illustrate a class of embodiments 1500 in which a single support structure 1502 is used, and wherein the support structure is coupled to the PCB in a manner such that the support structure covers the entire hole area of the through hole of the PCB. In the illustrated example, the support structure has the shape of rectangular plate, and is fabricated using a thermally conductive material such as metal (e.g., steel) so that thermal communication may be established, through the support structure, between the bottom side of the semiconductor package and a cooling device disposed on the bottom side of the PCB as shown in FIG. 17.

In this class of embodiments, the semiconductor package is at least partially exposed on the top side of the PCB, but not on the bottom side of the PCB due to the nature of the support structure. Thus, in these embodiments, the semiconductor package may have package contacts only on its top side. The top side package contacts may be electrically coupled to PCB contacts on the top side of the PCB, as shown at 700 in FIGS. 16 and 17. Cooling devices may be placed on both the top and the bottom sides of the semiconductor package, as shown in FIG. 17.

Figure 18:
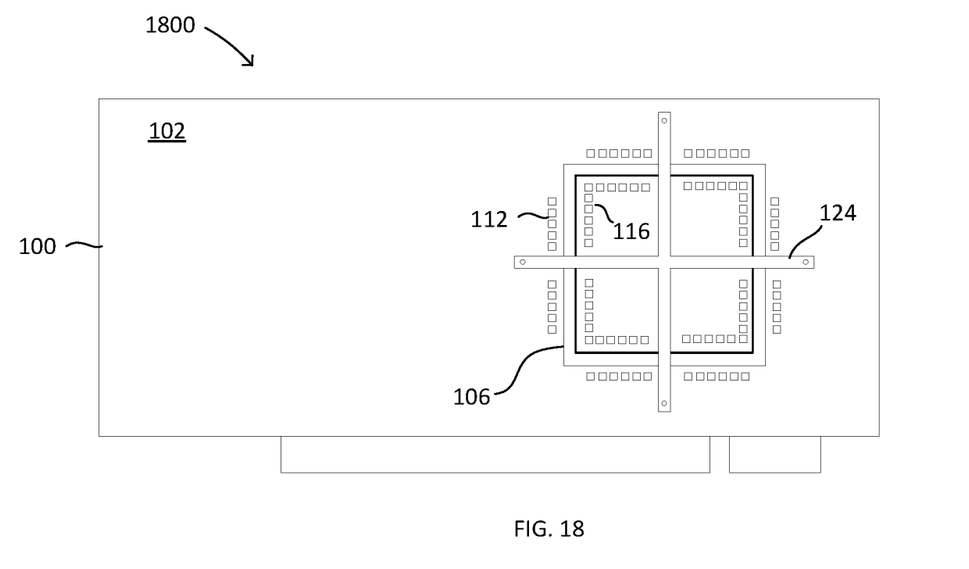
FIGS. 18 and 19 are bottom views illustrating classes of embodiments in which the support structures, the package contacts, and the PCB contacts, have different spatial arrangements and orientations relative to those in the embodiments of FIGS. 1-17.
Figure 19:
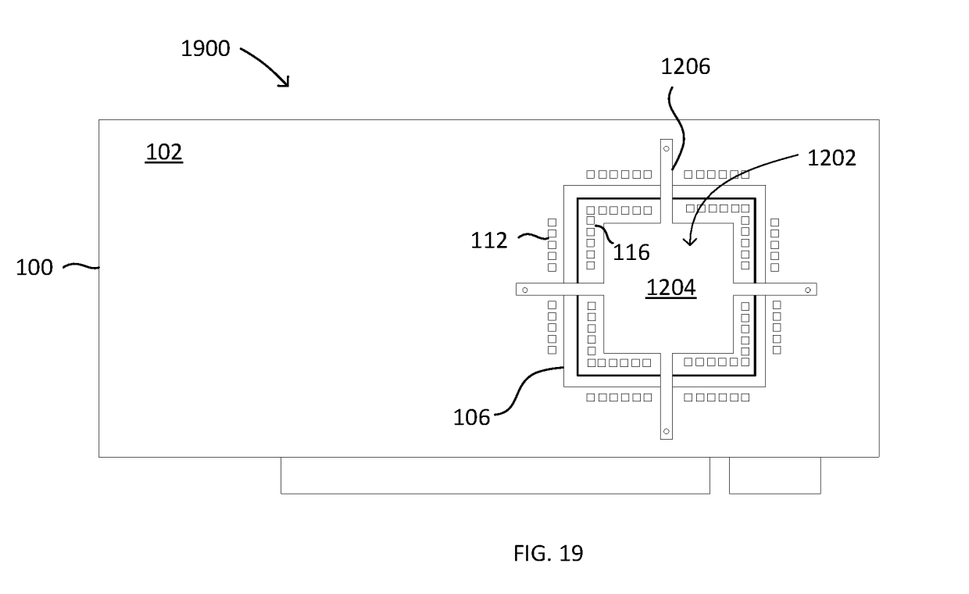

Many design variations are possible with respect to the shape of the support structure(s) and the techniques used to couple the support structures to the PCB. FIGS. 18 and 19 illustrate two such variations by way of example. In embodiment 1800, a cruciform support structure 124 is used, but is oriented such that its axes are parallel with the edges of the through hole of the PCB. In embodiment 1900, a support structure 1902 is used. This support structure is similar to support structure 1202 of FIG. 12 in that it includes a plate 1904 with at least two tabs 1906 extending outward from the plate. In embodiment 1900, however, the axes of the tabs of the support structure are oriented parallel with the edges of the plate. As in the previously described embodiments, the package contacts and the PCB contacts of embodiments 1800, 1900 are arranged so as to clear the areas where the support structures extend over the semiconductor package and over the PCB. In embodiments 1800, 1900, however, this is accomplished by grouping the package contacts into the corners of the rectangularly shaped semiconductor package rather than along its four edges. Other arrangements may also be used.

In any embodiments that include a support structure, one or more alignment features may be used to align the semiconductor package in the through hole of the PCB. This, in turn, may help to align the package contacts with the corresponding PCB contacts when the electrical connections between them are being established. A wide variety of such alignment feature embodiments is possible. In one class of embodiments, the alignment features may be configured to align the semiconductor package with the support structure, thus aligning the semiconductor package with the through hole by virtue of the support structure's alignment with the through hole. At the same time, the alignment features may be configured to maintain thermal communication between the semiconductor package and the support frame by maintaining contact between the exposed surface area of the semiconductor package and the adjacent surface area of the support frame. In another class of embodiments, the alignment features may be configured to align the semiconductor package with a cooling device, thus aligning the semiconductor package with the through hole by virtue of the cooling device's alignment with the through hole.

FIGS. 20-25 illustrate an example class of alignment features in which at least one raised element on a semiconductor package extends away from the semiconductor package in the direction of a support structure and is configured to engage a corresponding element on the support structure. The raised elements may be disposed on either the top or the bottom side, or on both sides, of a semiconductor package 2004, 2104, 2304, 2504. Embodiments in which the raised elements are disposed on both sides of the semiconductor package may be useful in cases where two support structures are in use—such as in the embodiment 1400 described above in relation to FIG. 14. The raised elements may comprise discrete components that are attached to the semiconductor package, or they may be integrally formed with the semiconductor package. They may be fabricated using any suitably rigid material, such as metal or plastic. In some embodiments, they may comprise the same material that is used to form the substrate of the semiconductor package.

In embodiments 2000 and 2100 (FIGS. 20 and 21), raised elements 2002, 2102 are disposed on one or both sides of a semiconductor package 2004, 2104. In these embodiments, a cruciform support structure, such as those described above, may fit within the recesses formed between the raised elements such that the raise elements engage with outside edges of the support structure, thus aligning the semiconductor package with the support structure. At the same time, the exposed surface area of the semiconductor package inside the recesses may be in thermal communication with the adjacent surface area of the support structure.

Figure 20:
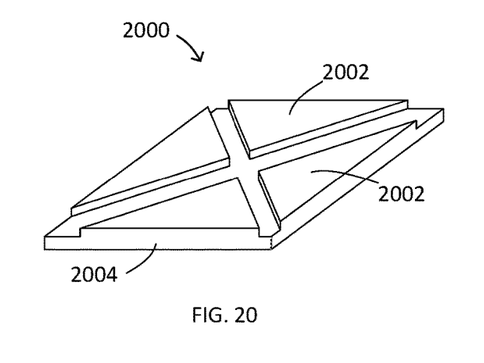
Figure 21:
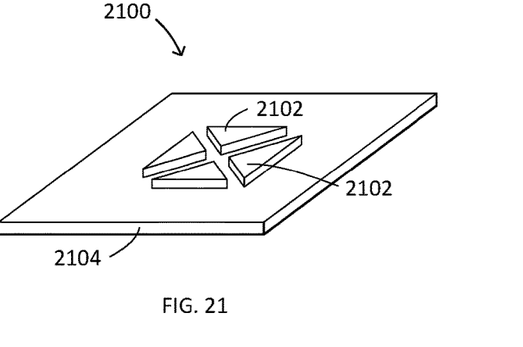

Raised elements similar to those illustrated in FIGS. 20 and 21 may also be located on an interface 808 of a cooling device 806. In the latter case, the raised elements may function either to accommodate the contour of the support structure, or to align the semiconductor package with the cooling device, or both. For embodiments in which a cruciform support structure is disposed between the cooling device and the semiconductor package, but in which the exposed surface of the support structure is not flush with the exposed surface of the semiconductor package, the raised elements on the interface member may be employed to allow the interface member to contact the semiconductor package directly in the areas where it is not covered by the support structure—thus improving thermal communication between the cooling device and the semiconductor package. In these embodiments, it may be beneficial to fabricate the raised elements of the interface member using a thermally conductive material such as metal.

In embodiments 2200, 2300 (FIGS. 22 and 23), one or more raised elements 2302 are disposed on one or both sides of a semiconductor package 2304. These raised elements have a shape that is configured to mate with a corresponding hole or recess 2202 in a support structure 2204. In the illustrated embodiment, the support structure includes a plate element such as the one used in embodiment 1200 described above in relation to FIGS. 12 and 13. A wide variety of shapes may be used in this class of embodiments, including linear shapes (such as a simple raised ridge) or polygonal shapes. In these embodiments, the surface area of the plate element of the support structure may remain in contact with the surface are of the semiconductor package surrounding the raised elements, thus maintaining thermal communication between the semiconductor package and the support structure.

Figure 22:
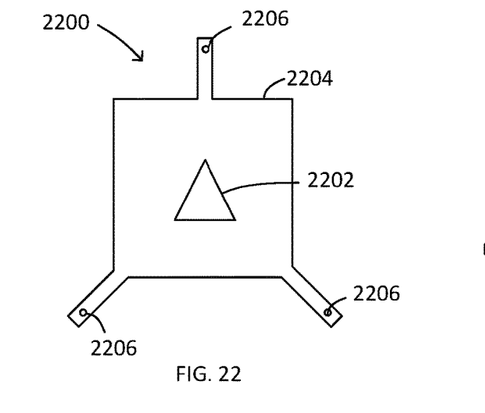
Figure 24:
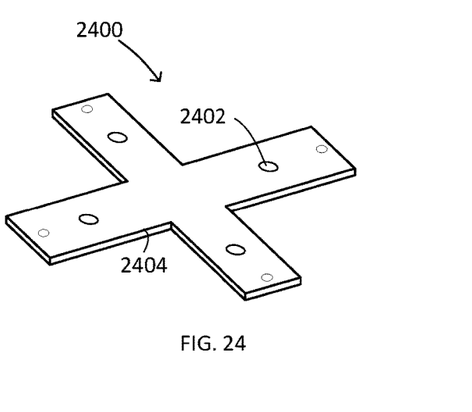
Figure 25:
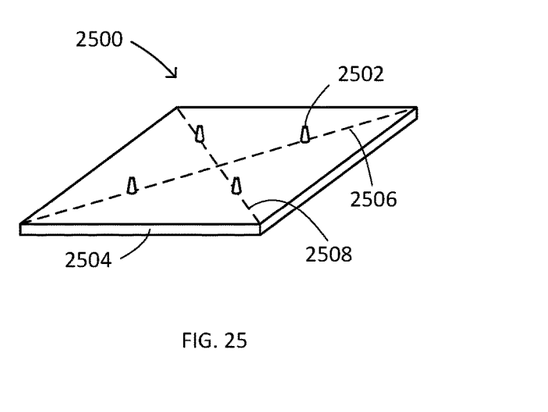
Figure 26:
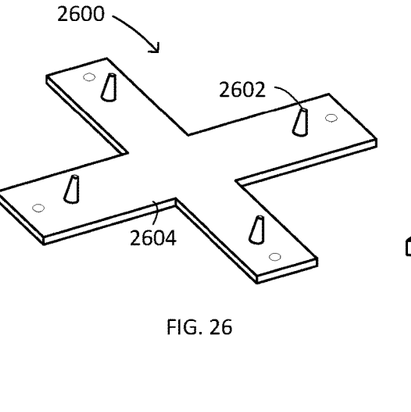
FIGS. 26-29 are various views illustrating an example class of alignment features in which a raised element on a support structure extends away from the support structure in the direction of the semiconductor package and engages a corresponding element on the semiconductor package in accordance with embodiments.
Figure 27:
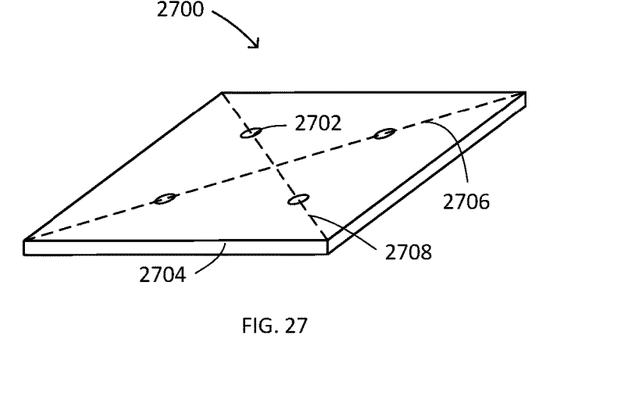
Figure 28:
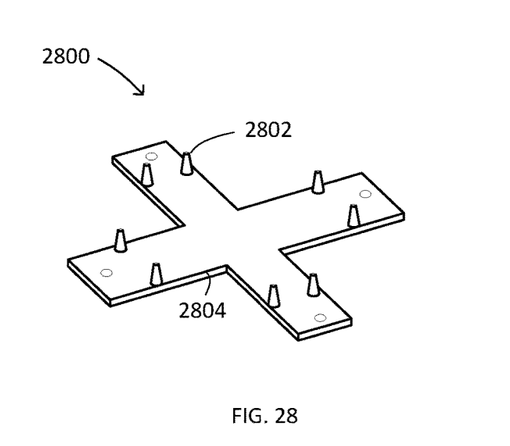
Figure 29:
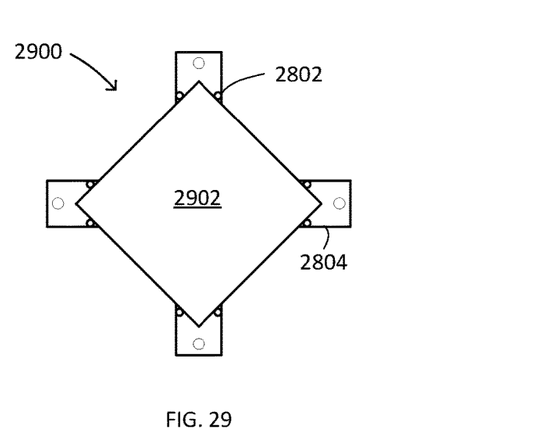

FIG. 22 also illustrates that support structures according to any of the embodiments described herein may comprise any number of points at which the support structure is coupled to the PCB. In embodiment 2200, for example, the support structure is designed to be coupled to a PCB at three points 2206.

In embodiments 2400, 2500 (FIGS. 24 and 25), one or more raised elements 2502 having the shape of pins or pegs are disposed on one or both sides of a semiconductor package 2504. The pins or pegs are configured to mate with corresponding holes or recesses 2402 formed in a support structure 2404. The surface area of the support structure touches the surface of the semiconductor package in the regions generally indicated by dashed lines 2506, 2508. Thus, thermal communication is maintained between the semiconductor package and the support structure.

FIGS. 26-29 illustrate an example class of alignment features in which at least one raised element on a support structure extends away from the support structure in the direction of a semiconductor package and is configured to engage a corresponding element on the semiconductor package. Such alignment features may be disposed on support structures located on either or both sides of a semiconductor package. The raised elements may comprise discrete components that are attached to the support structure, or they may be integrally formed with the support structure. They may be fabricated using any suitably rigid material, such as metal or plastic.

In embodiments 2600, 2700 (FIGS. 26 and 27), one or more raised elements 2602 having the shape of pins or pegs are disposed on a support structure 2604. The pins or pegs are configured to mate with corresponding holes or recesses 2702 disposed on a semiconductor package 2704. The surface area of the support structure touches the surface of the semiconductor package in the areas generally indicated by dashed lines 2706, 2708. Thus, thermal communication is maintained between the semiconductor package and the support structure.

In embodiments 2800, 2900 (FIGS. 28 and 29), one or more raised elements 2802 on a support structure 2804 are configured to engage outside edges of a semiconductor package 2902, as shown. The result is that the semiconductor package is aligned with the support structure, and the surface of the support structure adjacent to the surface of the semiconductor package is in contact with the semiconductor package. Thus, thermal communication is maintained between the semiconductor package and the support structure.

Multiple specific embodiments have been described above and in the appended claims. Such embodiments have been provided by way of example and illustration. Persons having skill in the art and having reference to this disclosure will perceive various utilitarian combinations, modifications and generalizations of the features and characteristics of the embodiments so described. For example, steps in methods described herein may generally be performed in any order, and some steps may be omitted, while other steps may be added, except where the context clearly indicates otherwise. Similarly, components in structures described herein may be arranged in different positions or locations, and some components may be omitted, while other components may be added, except where the context clearly indicates otherwise. The scope of the disclosure is intended to include all such combinations, modifications, and generalizations as well as their equivalents.

What is claimed is:

1. A semiconductor assembly, comprising:
   a printed circuit board ("PCB") having first and second PCB sides and having a through hole therein, wherein the through hole defines a hole area configured to receive a semiconductor package; and
   a metal support structure configured to be coupled to the first or the second side of the PCB such that, when so coupled, the support structure will extend at least partially across the through hole;
   wherein the PCB and the support structure are configured such that, when the support structure is coupled to the PCB and the semiconductor package is disposed at least partially inside the through hole, the support structure will touch at least part of the semiconductor package and the semiconductor package will be at least partially exposed on at least one of the first and the second PCB sides; and
   further comprising a raised alignment member disposed within the hole area at a point of engagement between the semiconductor package and the support structure, wherein the raised alignment member is configured to align the semiconductor package within the hole area of the PCB.

2. The semiconductor assembly of claim 1, wherein:
the raised alignment member comprises a raised element on the semiconductor package configured to engage with a corresponding element on the support structure.

3. The semiconductor assembly of claim 2, wherein:
the corresponding element on the support structure comprises a recess or a hole in the support structure.

4. The semiconductor assembly of claim 1, further comprising the semiconductor package disposed at least partially within the through hole of the PCB, and wherein:
the semiconductor package has first and second package sides comprising first and second package contacts, respectively;
the first package side is at least partially exposed on the first PCB side;
the second package side is at least partially exposed on the second PCB side;
the first package contacts are electrically coupled to first PCB contacts disposed on the first PCB side;
the second package contacts are electrically coupled to second PCB contacts disposed on the second PCB side; and
the second package side touches the support structure.

5. The semiconductor assembly of claim 2, wherein:
the corresponding element on the support structure comprises an edge of the support structure.

6. The semiconductor assembly of claim 1, wherein:
the raised alignment member comprises a raised element on the support structure configured to engage with a corresponding element on the semiconductor package.

7. The semiconductor assembly of claim 6, wherein:
the corresponding element on the semiconductor package comprises a recess or a hole in the semiconductor package.

8. The semiconductor assembly of claim 6, wherein:
the corresponding element on the semiconductor package comprises an edge of the semiconductor package.

9. The semiconductor assembly of claim 1, wherein:
the support structure has a cruciform shape having a center and four ends and is configured to be fastened to the PCB at each of the four ends such that the center is disposed over the through hole of the PCB.

10. The semiconductor assembly of claim 1, wherein:
the support structure comprises a plate with at least two tabs extending outwardly therefrom and is configured to be fastened to the PCB at each of the tabs such that the plate is disposed over the through hole of the PCB.

11. The semiconductor assembly of claim 3, wherein:
the semiconductor package has a rectangular shape comprising four edges; and
the first package contacts are disposed adjacent to each of the four edges.

12. The semiconductor assembly of claim 4, wherein:
the semiconductor package has a rectangular shape comprising four edges; and
the first and the second package contacts are disposed adjacent to each of the four edges.

13. The semiconductor assembly of claim 1, wherein:
the PCB comprises a peripheral component interconnect express ("PCIe") card.

14. A semiconductor assembly, comprising:
a printed circuit board ("PCB") defining a PCB plane, having first and second PCB sides parallel with the PCB plane, and having a through hole therein, wherein the through hole defines a hole area;
a semiconductor package distinct from the PCB, having top and bottom sides, and having a length, width and height, wherein the length and width define a package plane, and wherein the semiconductor package is disposed at least partially inside the through hole such that the package plane is parallel with the PCB plane, the entire length and the entire width are disposed within the hole area, a height of the semiconductor package is positioned at least partially between the first and the second sides of the PCB, the top side is at least partially exposed on the first side of the PCB, and the bottom side is at least partially exposed on the second side of the PCB;
top package contacts disposed on the top side of the semiconductor package in a peripheral area thereof, wherein the top package contacts are coupled to corresponding top PCB contacts disposed on the first side of the PCB adjacent to the through hole;
bottom package contacts disposed on the bottom side of the semiconductor package in a peripheral area thereof, wherein the bottom package contacts are coupled to corresponding bottom PCB contacts disposed on the second side of the PCB adjacent to the through hole; and
a support structure fastened to one side of the PCB and extending at least partially across the through hole such that a portion of the support structure is in contact with a supported one of the top or the bottom sides of the semiconductor package but clears the peripheral area occupied by the package contacts disposed on the supported side of the semiconductor package.

15. The semiconductor assembly of claim 14, further comprising:
a cooling device distinct from the support structure and fastened to the side of the PCB opposite to that on which the support structure is disposed;
wherein the cooling device comprises a member in thermal communication with a cooled side of the semiconductor package, opposite to the supported side of the semiconductor package, in a central area thereof but not in the peripheral area occupied by the package contacts disposed on the cooled side of the semiconductor package.

16. The semiconductor assembly of claim 15, further comprising:
a second cooling device distinct from the support structure and fastened to the side of the PCB on which the support structure is disposed, such that at least a portion of the support frame lies between the semiconductor package and the second cooling device;
wherein the second cooling device comprises a member in thermal communication with the supported side of the semiconductor package in a central area thereof but not the peripheral area occupied by the package contacts disposed on the supported side of the semiconductor package.

17. The semiconductor assembly of claim 16, wherein:
the support structure is thermally conductive, and at least part of the thermal communication between the second cooling device and the semiconductor package is provided by the support structure.

18. A semiconductor assembly, comprising:
a printed circuit board ("PCB") defining a PCB plane, having first and second PCB sides parallel with the PCB plane, and having a through hole therein, wherein the through hole defines a hole area;

a semiconductor package distinct from the PCB, having top and bottom sides, and having a length, width and height, wherein the length and width define a package plane, and wherein the semiconductor package is disposed inside the through hole such that the package plane is parallel with the PCB plane, the length and width are disposed within the hole area, a height of the semiconductor package is positioned at least partially between the first and second sides of the PCB, the top side is at least partially exposed on the first side of the PCB, and the bottom side is at least partially exposed on the second side of the PCB;

top package contacts disposed on the top side of the semiconductor package in a peripheral area thereof, wherein the top package contacts are coupled to corresponding top PCB contacts disposed on the first side of the PCB adjacent to the through hole;

bottom package contacts disposed on the bottom side of the semiconductor package in a peripheral area thereof, wherein the bottom package contacts are coupled to corresponding bottom PCB contacts disposed on the second side of the PCB adjacent to the through hole;

a first cooling device fastened to the first side of the PCB and having a first cooling member in thermal communication with the top side of the semiconductor package in a central area thereof but not in the peripheral area occupied by the top package contacts; and a second cooling device fastened to the second side of the PCB and having a second cooling member in thermal communication with the bottom side of the semiconductor package in a central area thereof but not in the peripheral area occupied by the bottom package contacts.

19. The semiconductor assembly of claim 18, further comprising:

a first support structure distinct from the first and second cooling devices, fastened to one side of the PCB, and extending at least partially across the through hole such that a portion of the first support structure is disposed between the semiconductor package and the cooling member disposed on the one side of the PCB but clears the peripheral area occupied by the package contacts that are coupled to the one side of the PCB.

20. The semiconductor assembly of claim 19, wherein:

the first support structure is thermally conductive, and at least part of the thermal communication between the semiconductor package and the cooling member on the one side of the PCB is provided by the first support structure.

21. The semiconductor assembly of claim 20, wherein:

the cooling member on the one side of the PCB comprises a recess adapted to accommodate a thickness of the first support structure such that a portion of the cooling member on the one side of the PCB is in contact with the first support structure and another portion of the cooling member on the one side of the PCB is in contact with the semiconductor package.

22. The semiconductor package of claim 19, further comprising:

a second support structure distinct from the first and second cooling devices, fastened to the other side of the PCB, and extending at least partially across the through hole such that a portion of the second support structure is disposed between the semiconductor package and the cooling member disposed on the other side of the PCB but clears the peripheral area occupied by the package contacts that are coupled to the other side of the PCB.

* * * * *